United States Patent
Sugitani et al.

(10) Patent No.: US 10,330,999 B2
(45) Date of Patent: Jun. 25, 2019

(54) DISPLAY PANEL AND METHOD OF MANUFACTURING THE SAME

(71) Applicant: SAMSUNG DISPLAY CO., LTD., Yongin, Gyeonggi-do (KR)

(72) Inventors: Koichi Sugitani, Hwaseong-si (KR); Hoon Kang, Suwon-si (KR); Chul-Won Park, Gwangmyeong-si (KR); Yang-Ho Jung, Seoul (KR); Jin-Ho Ju, Seoul (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 794 days.

(21) Appl. No.: 14/717,059

(22) Filed: May 20, 2015

(65) Prior Publication Data

US 2016/0085099 A1    Mar. 24, 2016

(30) Foreign Application Priority Data

Sep. 22, 2014  (KR) .................. 10-2014-0125851
Mar. 25, 2015  (KR) .................. 10-2015-0041455

(51) Int. Cl.
| | | |
|---|---|---|
| *G02F 1/1333* | (2006.01) | |
| *G02F 1/1335* | (2006.01) | |
| *G02F 1/1337* | (2006.01) | |
| *G02F 1/1341* | (2006.01) | |
| *G02F 1/1343* | (2006.01) | |

(Continued)

(52) U.S. Cl.
CPC .......... *G02F 1/1368* (2013.01); *G02F 1/1337* (2013.01); *G02F 1/1341* (2013.01); *G02F 1/133377* (2013.01); *G02F 1/133514* (2013.01); *G02F 1/133516* (2013.01); *H01L 27/124* (2013.01); *H01L 27/1214* (2013.01);
(Continued)

(58) Field of Classification Search
CPC .................................. G02F 1/133516
See application file for complete search history.

(56) References Cited

U.S. PATENT DOCUMENTS 4,770,713 A * 9/1988 Ward .................. C09D 9/00
   134/38
5,965,320 A * 10/1999 Torimitsu .............. C07C 303/28
   430/192

(Continued)

FOREIGN PATENT DOCUMENTS

JP   2008-242247   10/2008
KR   1020050031857   4/2005

(Continued)

OTHER PUBLICATIONS

Search Report dated Jan. 12, 2016 from the European Patent Office in corresponding European Patent Application No. 15185822.2.

*Primary Examiner* — Alexander P Gross
(74) *Attorney, Agent, or Firm* — F. Chau & Associates, LLC

(57) ABSTRACT

A display panel includes a substrate, a thin-film transistor (TFT) disposed on the substrate, a first electrode electrically connected to the thin-film transistor, a roof layer disposed on the first electrode and a liquid crystal layer. The roof layer includes an organic insulating material, and defines a cavity that overlaps the first electrode. The liquid crystal layer is disposed in the cavity and is in direct contact with the roof layer.

21 Claims, 12 Drawing Sheets

(51) Int. Cl.
*G02F 1/1362* (2006.01)
*G02F 1/1368* (2006.01)
*H01L 27/12* (2006.01)

(52) U.S. Cl.
CPC .... *H01L 27/1288* (2013.01); *G02F 1/134363* (2013.01); *G02F 2001/136222* (2013.01)

(56) References Cited

U.S. PATENT DOCUMENTS

| | | |
|---|---|---|
| 7,005,244 B2 | 2/2006 | Park et al. |
| 2008/0258196 A1* | 10/2008 | Chen ................ G02F 1/136213 257/296 |
| 2009/0185059 A1* | 7/2009 | Kim ...................... G03F 7/0007 348/273 |
| 2010/0026764 A1* | 2/2010 | Kamoda ................ B41J 2/1404 347/56 |
| 2012/0062448 A1* | 3/2012 | Kim .................. G02F 1/133377 345/55 |
| 2012/0249914 A1* | 10/2012 | Jung .................... H01L 27/124 349/43 |
| 2013/0143011 A1* | 6/2013 | Suzuki ................. G03F 7/0045 428/201 |
| 2014/0198283 A1 | 7/2014 | Jin et al. |
| 2014/0203301 A1 | 7/2014 | Kim et al. |
| 2014/0253836 A1 | 9/2014 | Hong et al. |

FOREIGN PATENT DOCUMENTS

| | | |
|---|---|---|
| KR | 1020130140325 | 12/2013 |
| KR | 1020140056489 | 5/2014 |

\* cited by examiner

DISPLAY PANEL AND METHOD OF MANUFACTURING THE SAME

CROSS-REFERENCE TO RELATED APPLICATION

This U.S. non-provisional application claims priority under 35 U.S.C. § 119 to Korean Patent Application No. 10-2014-0125851, filed on Sep. 22, 2014, and Korean Patent Application No. 10-2015-0041455, filed on Mar. 25, 2015, the disclosures of which are incorporated by reference herein in their entireties.

TECHNICAL FIELD

Exemplary embodiments of the present invention relate to a display panel and a method of manufacturing the same.

DISCUSSION OF RELATED ART

A display panel may include an array substrate, a color filter substrate and a liquid crystal layer disposed between the array substrate and the color filter substrate. The array substrate may include switching elements, and the color filter substrate may have color filters disposed thereon. The array substrate may include a first base substrate and the color filter substrate may include a second base substrate.

An embedded micro-cavity display panel may include switching elements and color filters on a single base substrate.

When the embedded micro-cavity display panel is manufactured, a sacrificial layer may be formed to form a tunnel-shaped cavity. The sacrificial layer may be hard-baked to harden the sacrificial layer and to remove gas included therein.

When a process temperature for hard-baking is increased, edges of the sacrificial layer may be disposed higher than a middle of the sacrificial layer due to thermal reflow. Thus, edges of the display panel corresponding to the edges of the sacrificial layer may be relatively dark and an aperture ratio may be decreased.

When layers are formed on the sacrificial layer without hard-baking to prevent thermal reflow, wrinkles may occur on an upper surface of the sacrificial layer. This may cause wrinkles on layers which are formed on the sacrificial layer.

SUMMARY

Exemplary embodiments of the present invention provide a display panel including a sacrificial layer and a roof layer including phase separable materials, which may increase an aperture ratio.

Exemplary embodiments of the present invention provide a method of manufacturing the display panel.

In accordance with an exemplary embodiment of the present invention, a display panel includes a substrate, a thin-film transistor (TFT) disposed on the substrate, a first electrode electrically connected to the thin-film transistor, a roof layer disposed on the first electrode and a liquid crystal layer. The roof layer includes an organic insulating material, and defines a cavity that overlaps the first electrode. The liquid crystal layer is disposed in the cavity and is in direct contact with the roof layer.

In an exemplary embodiment of the present invention, the cavity may have a tunnel shape.

In an exemplary embodiment of the present invention, the roof layer may be a color filter.

In an exemplary embodiment of the present invention, the display panel may further include a color filter overlapping the first electrode.

In an exemplary embodiment of the present invention, the display panel may further include a second electrode overlapping the first electrode and receiving a common voltage. The first electrode or the second electrode may include a plurality of slits.

In accordance with an exemplary embodiment of the present invention, a display panel includes a substrate, a thin-film transistor (TFT) disposed on the substrate, a first electrode electrically connected to the thin-film transistor, a roof layer disposed on the first electrode, an alignment layer and a liquid crystal layer. The roof layer includes an organic insulating material, and defines a cavity that overlaps the first electrode. The alignment layer is disposed in the cavity and is in direct contact with the roof layer. The liquid crystal layer is disposed in the cavity and is in direct contact with the alignment layer.

In accordance with an exemplary embodiment of the present invention, a method of manufacturing a display panel includes forming a thin-film transistor (TFT) and a first electrode electrically connected to the thin-film transistor on a substrate. A positive photoresist composition is deposited on the first electrode to form a sacrificial layer. The sacrificial layer is light-exposed and developed to form a sacrificial pattern. A negative photoresist composition is deposited on the sacrificial pattern to form a roof layer in direct contact with the sacrificial pattern. The sacrificial pattern is removed.

In an exemplary embodiment of the present invention, the positive photoresist composition may include a polyamide compound, a photosensitive quinone diazide compound and a first solvent.

In an exemplary embodiment of the present invention, the negative photoresist composition may include an acryl compound, a photo initiator and a second solvent. The roof layer may entirely cover the sacrificial pattern.

In an exemplary embodiment of the present invention, the polyamide compound may be insoluble in the second solvent. The acryl compound may be insoluble in the first solvent.

In an exemplary embodiment of the present invention, the first solvent may include propylene glycol monomethyl ether (PGME), cyclohexanone, ethyle lactate (EL), γ-butyrolactone (GBL) or N-methylpyrrolidione (NMP).

In an exemplary embodiment of the present invention, the second solvent may include propylene glycol methyl ether acetate (PGMEA).

In an exemplary embodiment of the present invention, the negative photoresist composition may include an acryl compound, a photo initiator, a coloring agent and a second solvent. The roof layer may be a color filter partially covering the sacrificial pattern.

In an exemplary embodiment of the present invention, a protection layer may be further formed to cover the color filter.

In an exemplary embodiment of the present invention, a color filter may be further formed under the first electrode In an exemplary embodiment of the present invention, the tunnel may have a tunnel shape.

In an exemplary embodiment of the present invention, an amide stripper may be provided to the sacrificial pattern to remove the sacrificial pattern.

In an exemplary embodiment of the present invention, a liquid crystal may be injected into a space formed by removing the sacrificial pattern to form a liquid crystal layer.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF THE EMBODIMENTS

Hereinafter, exemplary embodiments of the present invention will be described in more detail with reference to the accompanying drawings.

Figure 1:
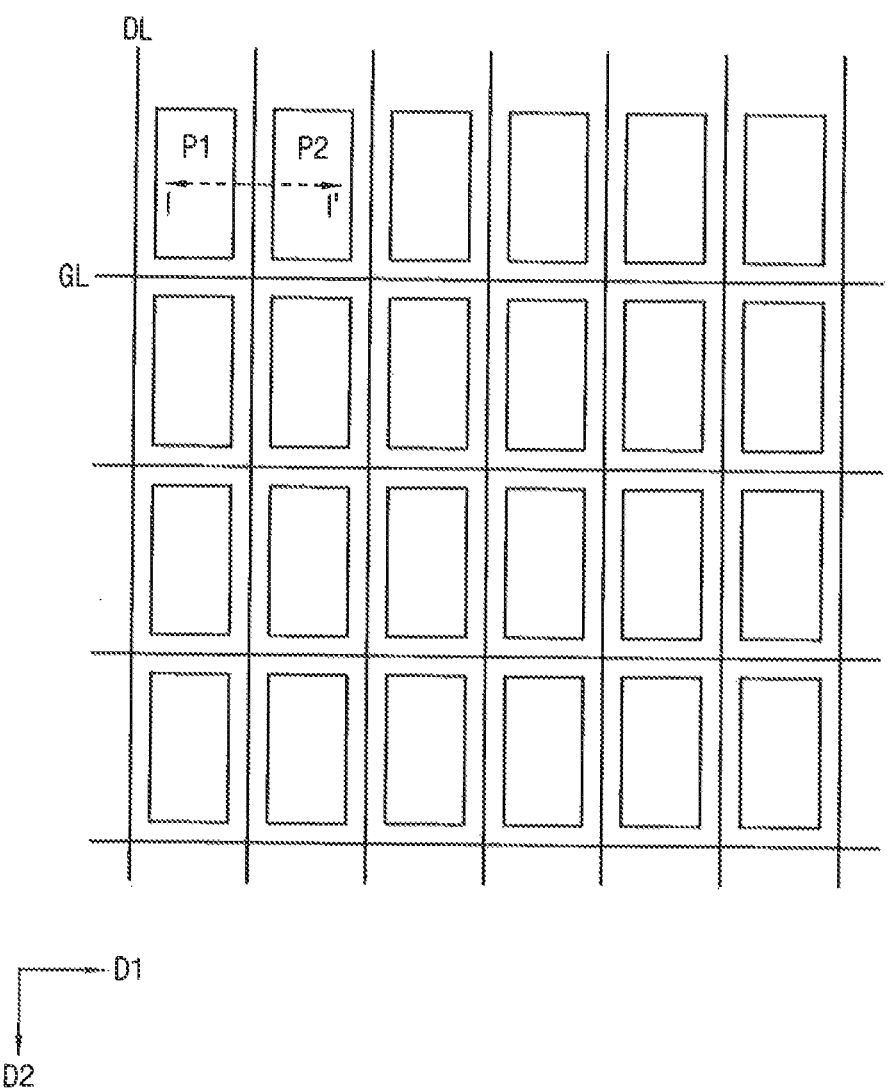
FIG. 1 is a plan view illustrating a display panel in accordance with an exemplary embodiment of the present invention.

FIG. 1 is a plan view illustrating a display panel in accordance with an exemplary embodiment of the present invention.

Referring to FIG. 1, a display panel may include a plurality of gate lines GL, a plurality of data lines DL and a plurality of pixels (e.g., pixels P1 and P2).

The gate lines GL may extend in a first direction D1. The data lines DL may extend in a second direction substantially perpendicular to the first direction D1. The gate lines GL may extend in the second direction D2 and the data lines DL may extend in the first direction D1.

The pixels may be disposed in a matrix shape. The pixels may be respectively disposed in areas defined by the gate lines GL and the data lines DL.

Each pixel may be connected to a corresponding gate line GL and a corresponding data line DL adjacent to the pixel.

Each pixel may have a rectangular shape extending in the second direction D2, a V-shape, or a Z-shape, for example.

Figure 2:
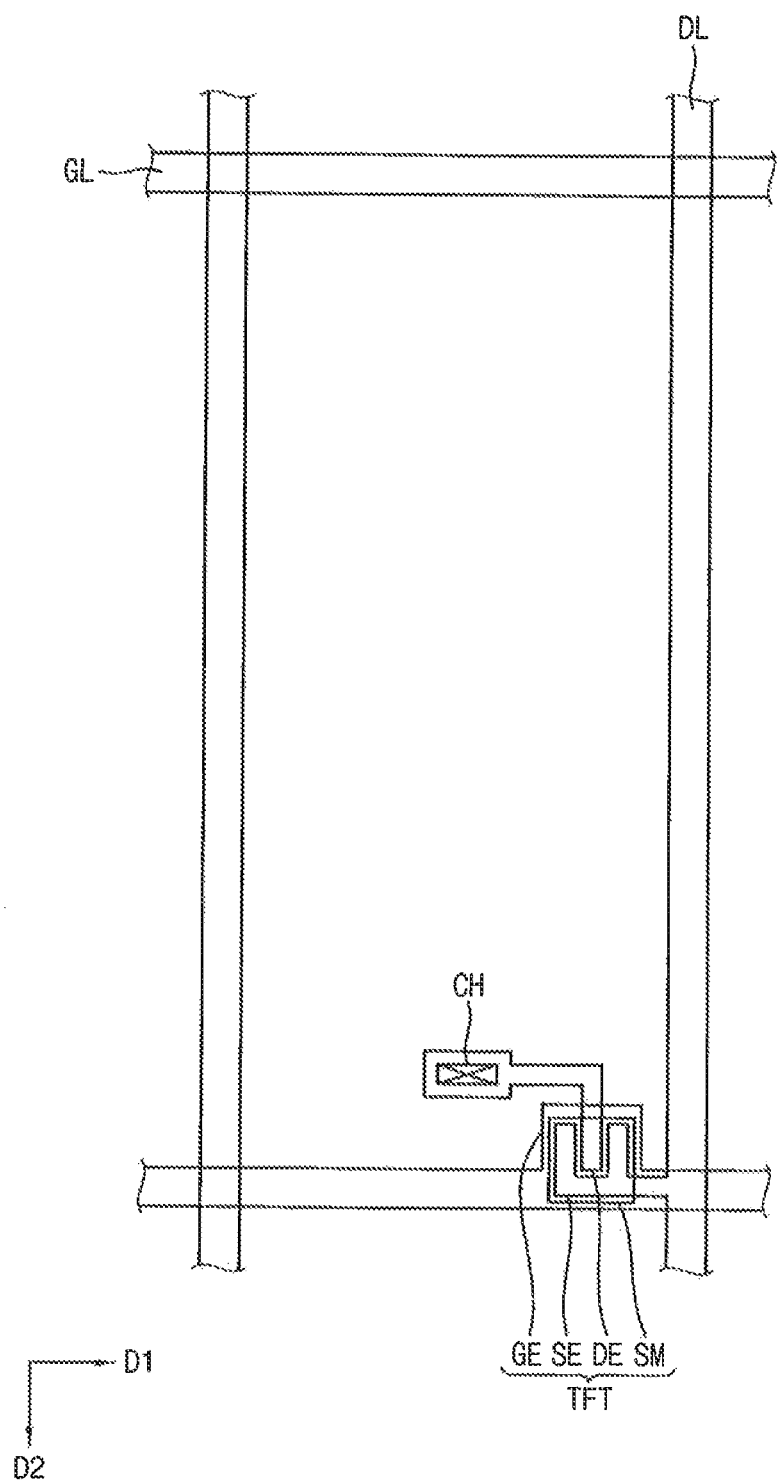
FIG. 2 is a plan view illustrating a first pixel of the display panel in FIG. 1 in accordance with an exemplary embodiment of the present invention.
Figure 3:
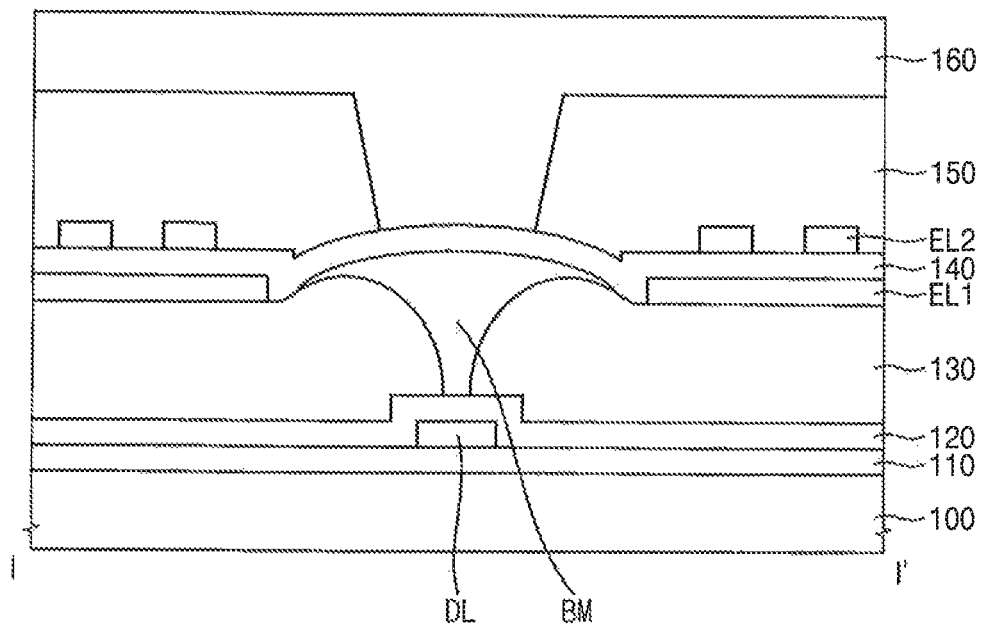
FIG. 3 is a cross-sectional view taken along line I-I' in FIG. 1 in accordance with an exemplary embodiment of the present invention.

FIG. 2 is a plan view illustrating a pixel of the display panel in FIG. 1 in accordance with an exemplary embodiment of the present invention. FIG. 3 is a cross-sectional view taken along line I-I' in FIG. 1 in accordance with an exemplary embodiment of the present invention.

Referring to FIGS. 1 to 3, the display panel may include a substrate 100, thin film transistors TFT, a gate insulating layer 110, a data insulating layer 120, a black matrix BM, a color filter 130, a first electrode EL1, a passivation layer 140, a second electrode EL2, a liquid crystal layer 150 and a roof layer 160.

The substrate 100 may be a transparent insulating substrate. According to exemplary embodiments of the present invention, the transparent insulating substrate may be, but is not limited to, a glass substrate, or a plastic substrate.

The substrate 100 may include a plurality of pixel areas for displaying an image. The plurality of the pixel areas may be disposed in a matrix shape having a plurality of rows and a plurality of columns.

Each pixel may include a switching element. For example, the switching element may be the thin film transistor TFT. The switching element may be connected to the gate line GL and the data line DL adjacent to the switching element. The switching element may be disposed at a crossing area of the gate line GL and the data line DL.

A gate pattern may include a gate electrode GE and the gate line GL. The gate pattern may be disposed on the substrate 100. The gate line GL may be electrically connected to the gate electrode GE.

The gate insulating layer 110 may be disposed on the substrate 100 and may cover the gate pattern. The gate insulating layer 110 may insulate the gate pattern.

A semiconductor pattern SM may be disposed on the gate insulating layer 110. The semiconductor pattern SM may overlap the gate electrode GE.

A data pattern may include the data line DL, a source electrode SE and a drain electrode DE. The data pattern may be disposed on the semiconductor pattern SM, which may be disposed on the gate insulating layer 110. The source electrode SE may overlap the semiconductor pattern SM. The source electrode SE may be electrically connected to the data line DL.

The drain electrode DE may be spaced apart from the source electrode SE on the semiconductor pattern SM. The semiconductor pattern SM may have a conductive channel between the source electrode SE and the drain electrode DE.

The thin film transistor TFT may include the gate electrode GE, the source electrode SE, the drain electrode DE and the semiconductor pattern SM.

The data insulating layer 120 may be disposed on the gate insulating layer 110. The data insulating layer 120 may insulate the data pattern.

The gate insulating layer 110 and the data insulating layer 120 may include an organic insulating material or an inorganic insulating material. For example, the gate insulating layer 110 and the data insulating layer 120 may include silicon oxide ($SiO_x$) and/or silicon nitride ($SiN_x$).

A plurality of color filters 130 and a plurality of black matrices BM may be disposed on the data insulating layer 120.

The color filters 130 may be disposed between adjacent data lines DL. The color of light may be changed by the color filters 130 and the light may penetrate the liquid crystal layer 150.

Each color filter 130 may correspond to one of the pixel areas. For example, the color filters 130 may include a red color filter, green color filter and a blue color filter. The color filters 130, which may be adjacent to each other, may have different colors from each other. For example, the color filters 130 may be spaced apart from a border between adjacent pixel areas.

The color filters 130 may be disposed in an island shape and may be spaced apart from each other. Alternatively, the color filters 130 may be adjacent to each other and may partially overlap each other at a border between adjacent pixel areas.

The display panel may include signal lines and black matrices BM. The signal lines may be connected to the thin film transistor TFT. The black matrices BM may overlap the signal lines and may block light.

The black matrices BM may be disposed on a border between adjacent pixel areas. For example, the black matrices BM may be disposed between adjacent color filters 130.

The black matrices BM may be disposed on an area where the gate line GL, the data line DL and the switching element are disposed. For example, the black matrices BM may be disposed on a non-display area.

For example, the black matrices BM may include a photosensitive organic material including a pigment, such as carbon black.

The first electrode EL1 may be disposed on the color filter 130. The first electrode EL1 may be disposed in the pixel area. The first electrode EL1 may overlap the color filter 130. The first electrode EL1 may be electrically connected to the thin film transistor TFT. A grayscale voltage may be applied to the first electrode EL1 through the thin film transistor TFT.

For example, the first electrode EL1 may include a transparent conductive material, such as indium tin oxide (ITO), indium zinc oxide (IZO) and/or aluminum zinc oxide (AZO). The first electrode EL1 may have a continuous plate shape.

The passivation layer 140 may be disposed on the first electrode EL1 and the black matrices BM. The passivation layer 140 may cover the first electrode EL1 and the black matrices BM. The passivation layer 140 may be formed on a whole surface of the substrate 100.

The passivation layer 140 may include an organic insulating material or an inorganic insulating material. For example, the passivation layer 140 may include silicon oxide ($SiO_X$) and/or silicon nitride ($SiN_X$).

The second electrode EL2 may be disposed on the passivation layer 140. The passivation layer 140 may overlap the first electrode EL1.

For example, the second electrode EL2 may include a transparent conductive material such as indium tin oxide (ITO), aluminum zinc oxide (AZO) and/or indium zinc oxide (IZO). For example, the second electrode EL2 may have a slit pattern.

For example, a common voltage may be applied to the second electrode EL2. Thus, the first electrode EL1 may function as a pixel electrode, and the second electrode EL2 may function as a common electrode. In another exemplary embodiment, the second electrode EL2 may be electrically connected to the thin film transistor TFT to receive the grayscale voltage, and the first electrode EL1 may receive the common voltage. Furthermore, the first electrode EL1 may have a slit pattern, and the second electrode EL2 may have a continuous plate shape.

The liquid crystal layer 150 may be disposed on one or more of the color filters 130 and may overlap one or more of the color filters 130.

The liquid crystal layers 150 may be disposed on adjacent pixel areas, and the liquid crystal layers 150 may be spaced apart from the data lines, which may be a border.

The liquid crystal layer 150 may include one or more liquid crystal molecules. The liquid crystal molecules may be aligned by an electric field applied between the first electrode EL1 and the second electrode EL2. Therefore, a light transmittance of the pixel may be controlled.

The roof layer 160 may be disposed on the liquid crystal layer 150. The roof layer 160 may be in direct contact with the liquid crystal layer 150.

The roof layer 160 may cover the liquid crystal layer 150. The roof layer may include a wall 161 disposed between the liquid crystal layers 150. For example, the wall 161 may overlap with the data lines DL. The wall 161 may maintain a shape of the roof layer 160. The roof layer 160 may include a plurality of walls.

The roof layer 160 may include an organic insulating material. For example, the organic insulating material may include a material capable of being hardened by exposure to light or heat. Thus, the roof layer 160 may be hardened by exposure to heat or light.

A stripper injecting hole may be formed in the roof layer 160, thereby exposing the liquid crystal layer 150. An encapsulating layer may also be disposed on the roof layer 160. The encapsulating layer may cover the stripper injecting hole and may prevent the liquid crystal molecules from leaking.

FIGS. 4A, 4B, 4C, 4D, 4E and 4F are cross-sectional views taken along the line I-I' in FIG. 1 illustrating a method of manufacturing a display panel in accordance with exemplary embodiments of the present invention.

Referring to FIGS. 1 to 4F, steps of manufacturing a display panel in accordance with an exemplary embodiment of the present invention are illustrated in more detail.

Referring to FIGS. 1 to 4C, the gate insulating layer 110, the data line DL, the data insulating layer 120, the color filter 130, the black matrix BM, the first electrode EL1 and the second electrode EL2 may be formed on the substrate 100. A sacrificial layer SL may be formed on the substrate 100.

The gate pattern including the gate electrode GE and the gate line GL may be formed on the substrate 100. A first conductive layer may be formed on the substrate 100 and may be patterned by a photolithograph process, thus forming the gate pattern.

The gate insulating layer 110 may be formed on the substrate 100 to cover the gate pattern. The gate insulating layer 110 may insulate the gate pattern.

The semiconductor pattern SM may be formed on the gate insulating layer 110. The semiconductor pattern SM may overlap the gate electrode GE.

The data pattern including the data line DL, the source electrode SE and the drain electrode DE may be formed on the gate insulating layer 110 on which the semiconductor pattern SM may be formed. A second conductive layer may be formed on the gate insulating layer 110 and may be patterned by a photolithography process, thus forming the data pattern.

The drain electrode DE may be spaced apart from the source electrode SE with respect to the semiconductor pattern SM. The semiconductor pattern SM may have a conductive channel between the source electrode SE and the drain electrode DE.

The thin film transistor TFT may include the gate electrode GE, the source electrode SE, the drain electrode DE and the semiconductor pattern SM.

The data insulating layer 120 may be formed on the gate insulating layer 110 on which the data pattern may be formed.

The color filter 130 may be formed on the substrate 100 on which the data line DL may be formed. The color filter 130 may be disposed between adjacent data lines DL.

The black matrix BM may be formed on a border between adjacent pixel areas. For example, the black matrix BM may be disposed between adjacent color filter 130. The black matrix BM may be disposed on an area where the gate line GL, the data line DL and the switching element are disposed. For example, the black matrix BM may include a photosensitive organic material including a pigment, such as carbon black. For example, the display panel may include a plurality of black matrices BM.

A positive photoresist composition may be deposited on the color filter 130 and the black matrix BM, thus forming the sacrificial layer SL.

The sacrificial layer SL may be partially removed, which may form a space for forming a cavity. Accordingly, the sacrificial layer SL may be formed at a position where the liquid crystal layer 150 is formed. The sacrificial layer SL may determine a width and height of the cavity.

The sacrificial layer SL may be formed by depositing the positive photoresist composition.

The positive photoresist composition will be described in more detail below with respect to a negative photoresist composition.

For example, the sacrificial layer SL may be formed by an inkjet process, or a spin-coating process.

The sacrificial layer SL may be soft-baked prior to being exposed to light. For example, the sacrificial layer SL may be soft-baked within a temperature range of about 120° C. to about 130° C.

The mask MASK may include a transparent part T and a blocking part B. The mask MASK may be disposed above the substrate 100. The transparent part T may allow light to pass through it to the data line DL and the black matrix BM. The blocking part B may block light emitted toward the color filter 130. The sacrificial layer SL may be exposed to light using the mask MASK.

An exposed portion of the sacrificial layer SL may be partially removed by using a developer, thus forming a sacrificial pattern SL'.

The developer may include an alkali solution. For example, the developer may be an amide solution.

Figure 4A:
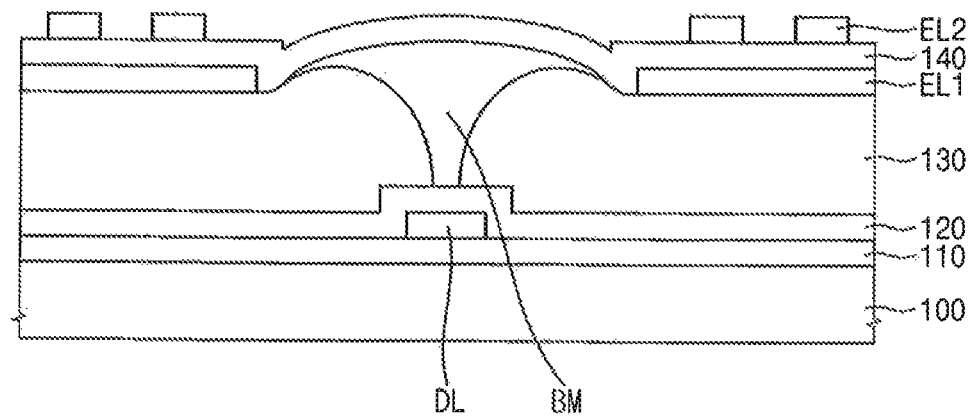
FIGS. 4A, 4B, 4C, 4D, 4E and 4F are cross-sectional views taken along the line I-I' in FIG. 1 illustrating a method of manufacturing a display panel in accordance with exemplary embodiments of the present invention.
Figure 4B:
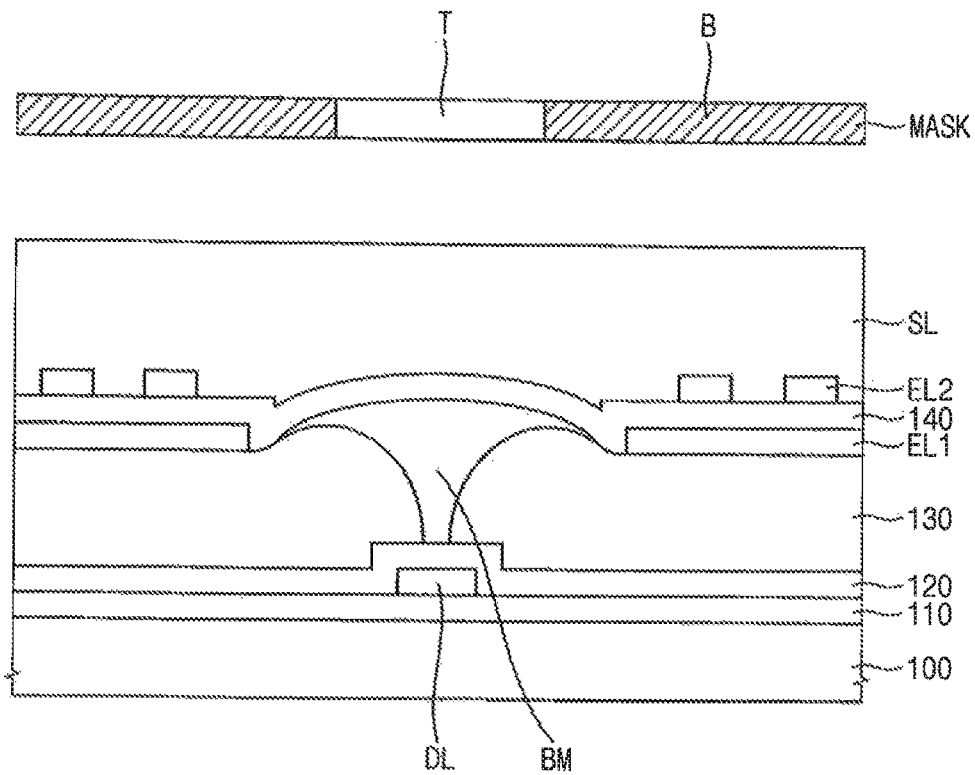
Figure 4C:
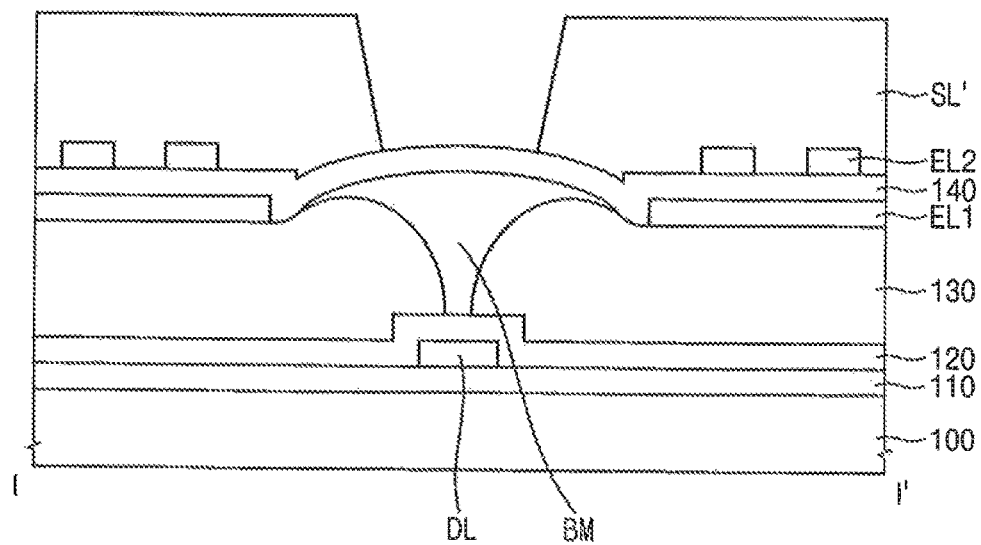
Figure 4D:
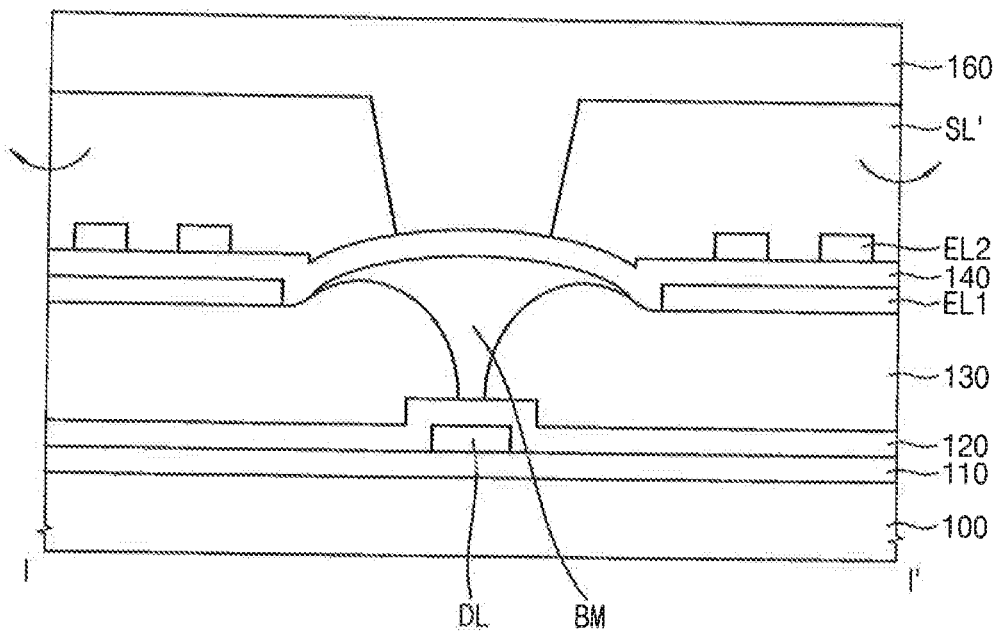
Figure 4E:
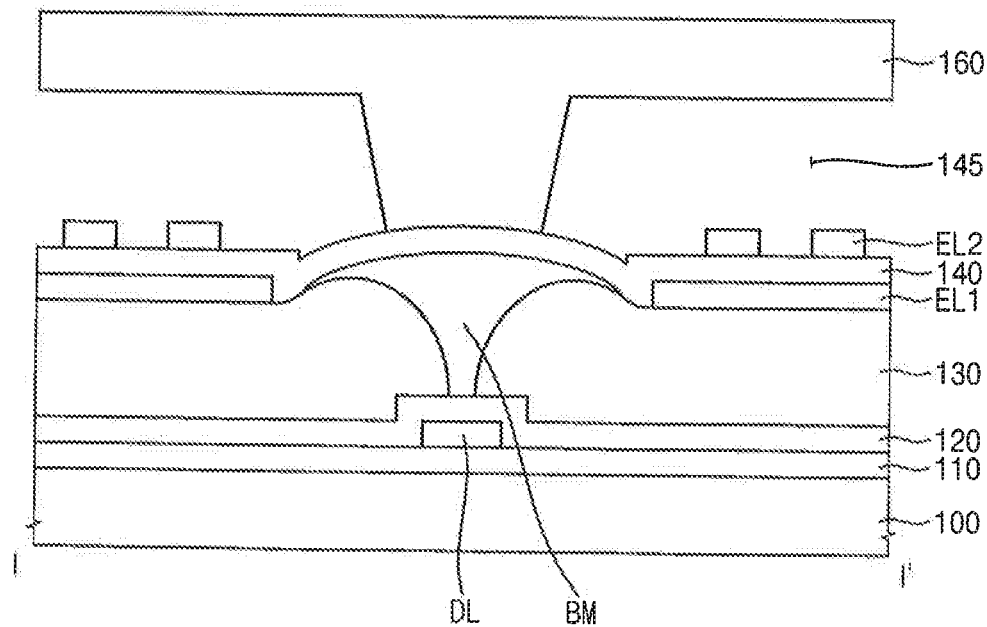
Figure 4F:
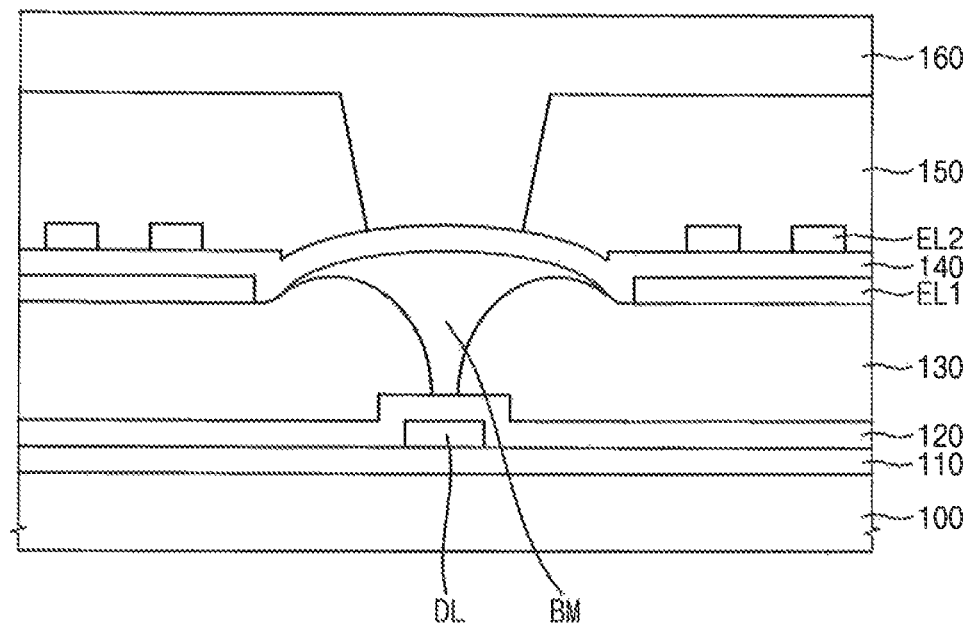

Referring to FIG. 4D, the negative photoresist composition may be deposited on the sacrificial patter SL' thus forming a roof layer 160.

The roof layer 160 may be formed on the sacrificial pattern SL'. The roof layer 160 may be in direct contact with the sacrificial pattern SL'. The roof layer 160 may entirely cover the sacrificial pattern SL'.

Phases of the sacrificial pattern SL' and the roof layer 160 may be separated from each other. The roof layer 160 may include the negative photoresist composition and the sacrificial pattern SL' may include the positive photoresist composition, thus the roof layer 160 and the sacrificial pattern SL' may not be mixed so that a separation between the roof layer 160 and the sacrificial pattern SL' may be maintained.

For example, the positive photoresist composition may include a polyamide compound, a photosensitive quinone diazide compound and a first solvent.

For example, the polyamide compound may include polyamic acid, which is a precursor of polyimide. Polyamic acid may be cured to form a polyimide resin. For example, the polyamide compound may include a repeating unit represented by the following Chemical Formula 1.

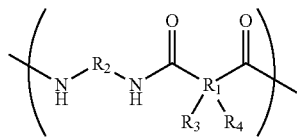

<Chemical Formula 1>

R1 and R2 may be respectively an alkyl group (alkylene group) having 1 to 20 carbon atoms or an aromatic group, R3 and R4 may be respectively an alkyl group having 1 to 20 carbon atoms, an aromatic group or

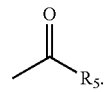

R5 may be a hydrogen atom, a hydroxyl group, an alkyl group having 1 to 20 carbon atoms or an aromatic group.

The polyamide compound may be formed by a condensation reaction between a diamine compound and dianhydride compound.

Thus, R2 may be derived from the diamine compound. For example, the diamine compound may be 3,4'-diaminodiphenylether, 4,4'-diaminodiphenylether, 3,4'-diaminodiphenylmethane, 4,4'-diaminodiphenylmethane, 4,4'-diaminodiphenylsulfone, 4,4'-diaminodiphenylsulfide, benzidine, m-phenylenediamine, p-phenylenediamine, 1,5-naphthalenediamine, 2,6-naphthalenediamine, bis(4-aminophenoxyphenyl)sulfone, bis(3-aminophenoxyphenyl)sulfone, bis(4-aminophenoxy)biphenyl, bis[4-(4-aminophenoxy)phenyl]ether, or 1,4-bis(4-aminophenoxy)benzene.

A weight-average molecular weight of the polyamide compound may be in a range of about 3,000 to about 300,000. The polyamide compound having this range of weight-average molecular weight may have relatively high solubility in the first solvent.

The photosensitive quinone diazide compound may include naphthoquinone diazide or benzoquinone diazide.

The polyamide compound may be soluble in the first solvent.

For example, the first solvent may include propylene glycol monomethyl ether (PGME), cyclohexanone, ethyle lactate (EL), γ-butyrolactone (GBL) and/or N-methylpyrrolidione (NMP).

For example, based on a total weight of the positive photoresist composition, the positive photoresist composition may include about 5 wt % to about 70 wt % of the polyamide compound, about 0.5 wt % to about 30 wt/o of the photosensitive quinone diazide compound and a remainder of the first solvent.

The negative photoresist composition may include an acryl compound, a photo initiator and a second solvent.

For example, the acryl compound may be polyacrylate resin, or poly methacrylate resin.

For example, the photo initiator may be a halogen-containing iminosulfonate photo initiator including a halogen, a diazonaphthoquinone-4-sulfonate photo acid generator, or a triazine photo initiator.

The acryl compound may be soluble in the second solvent.

For example, the second solvent may include propylene glycol methyl ether acetate (PGMEA).

For example, the polyamide compound may be insoluble in the second solvent.

The second solvent does not include a functional group capable of hydrogen bonding so that the polyamide compound having a polarity may be relatively insoluble in the second solvent.

For example, based on a total weight of the negative photoresist composition, the negative photoresist composition may include about 5 wt % to about 70 wt % of the acryl compound, about 1 wt % to about 35 wt % of the photo initiator and a remainder of the second solvent.

Thus, when the negative photoresist composition is deposited on the sacrificial pattern SL', the sacrificial pattern SL' and the negative photoresist composition are not mixed, thus separating phases thereof and maintaining a shape of the roof layer 160.

Referring to FIGS. 1 to 4E, after forming the roof layer 160, the sacrificial pattern SL' may be removed using a stripper.

Prior to removing the sacrificial pattern SL' using the stripper, a stripper injection hole may be formed. Furthermore, the substrate including the sacrificial pattern SL' may be entirely exposed to a light to increase a solubility of the sacrificial pattern SL' before the stripper is provided.

The stripper may be injected into the sacrificial pattern SL' through the stripper injection hole. Thus, a cavity 145 may be formed in a position where the sacrificial pattern SL' was formed. The cavity 145 may have a tunnel shape extending in a direction. For example, the cavity 145 may extend in a direction substantially parallel to the data line DL. The cavity 145 may overlap at least one of the first electrode EL1 and the second electrode EL2.

The stripper may include an alkali solution. For example, the stripper may be an amide solution. The stripper including the amide solution may entirely remove the sacrificial pattern SL', however a structure of the roof layer 160 may be maintained.

The removal of the sacrificial pattern SL' by the developer may be performed at about 23° C. to about 26° C. The removal of the sacrificial pattern SL' may be accelerated by increasing the processing temperature. For example, the sacrificial pattern SL' may be removed by the developer at about 23° C. to about 80° C.

Referring to FIGS. 1 to 4F, liquid crystal may be injected into the cavity 145, thus forming the liquid crystal layer 150.

The liquid crystal may be in the form of a fluid. The liquid crystal may flow into the cavity 145 by capillary action. For example, the liquid crystal may be provided into the cavity 145 through the stripper injecting hole.

The liquid crystal may be provided into the cavity 145 by using an inkjet having a micropipette. Alternatively, the liquid crystal may be provided into the cavity 145 by using a vacuum injection apparatus.

An encapsulating layer may be disposed on the roof layer 160 so that the encapsulating layer may cover the stripper injecting hole to prevent the liquid crystal from leaking.

Figure 5:
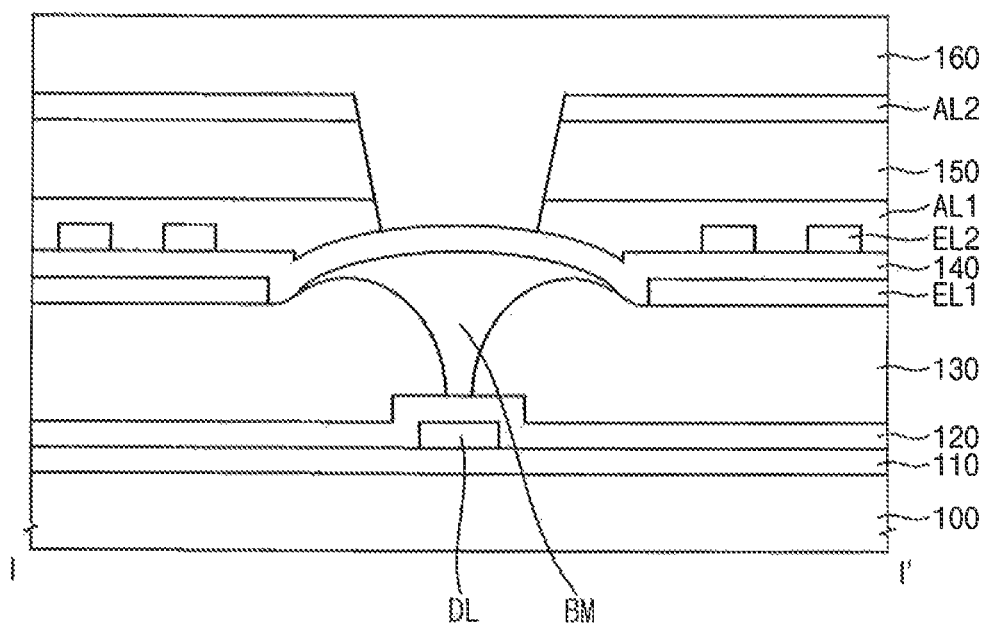
FIG. 5 is a cross-sectional view taken along the line I-I' in FIG. 1 in accordance with an exemplary embodiment of the present invention.

FIG. 5 is a cross-sectional view taken along the line I-I' in FIG. 1 in accordance with an exemplary embodiment of the present invention.

Referring to FIG. 5, the display panel may include the substrate 100, thin film transistors TFT, the gate insulating layer 110, the data insulating layer 120, the black matrix BM, the color filter 130, the first electrode EL1, the passivation layer 140, the second electrode EL2, the lower alignment layer AL1, the liquid crystal layer 150, the upper alignment layer AL2 and the roof layer 160.

The display panel illustrated in FIG. 5 may be substantially the same as that of the display panel illustrated in FIG. 3 except for the lower alignment layer AL1 and the upper alignment layer AL2, and thus repetitive explanations concerning the above elements may be omitted.

The lower alignment layer AL1 may be disposed on the color filters 130. For example, the lower alignment layer AL1 may be disposed between the passivation layer 140 and the second electrode EL2.

The liquid crystal layer 150 may be disposed on the lower alignment layer AL1. The liquid crystal layer 150 may overlap the color filters 130.

The upper alignment layer AL2 may be disposed on the liquid crystal layer 150.

The roof layer 160 may be in direct contact with the upper alignment layer AL2, thus covering the upper alignment layer AL2. For example, the roof layer 160 may include an organic insulating material.

The lower alignment layer AL1 and the upper alignment layer AL2 may pretilt the liquid crystal molecules of the liquid crystal layer 150.

For example, the lower alignment layer AL1 and the upper alignment layer AL2 may have a thickness of about 10 µm to about 100 µm.

The lower alignment layer AL1 and the upper alignment layer AL2 may include an aligning composition.

The liquid crystal layer 150 may be exposed through the roof layer 160 by forming a stripper injection hole.

The aligning composition may be deposited in the cavity 145 through the stripper injection hole, and then the aligning composition may be dried to remove a solvent thereof. For example, the aligning composition may be dried at room temperature or may be heated.

While the sacrificial pattern SL' and the roof layer 160 are formed on the color filter 130 in the above exemplary embodiment, a color filter may function as a roof layer in another exemplary embodiment.

FIGS. 6A, 6C, 6E, 6G, 6I, 6K and 6L are cross-sectional views taken along line I-I' in FIG. 1 and illustrating a method of manufacturing a display panel in accordance with exemplary embodiments of the present invention. FIGS. 6B, 6D, 6F and 6J are plan views illustrating a method of manufacturing a display panel in accordance with exemplary embodiments of the present invention. Particularly, FIG. 6B is a plan view of FIG. 6A. FIG. 6D is a plan view of FIG. 6C. FIG. 6F is a plan view of FIG. 6E. FIG. 6H is a plan view of FIG. 6G. FIG. 6J is a plan view of FIG. 6I.

A configuration of a thin film transistor of the display panel may be explained with reference to FIG. 2. The display panel may be substantially the same as the display panel illustrated in FIGS. 1, 2, and 5 except for including a color filter functioning as a roof layer. Thus, any duplicated explanation may be omitted.

Figure 6A:
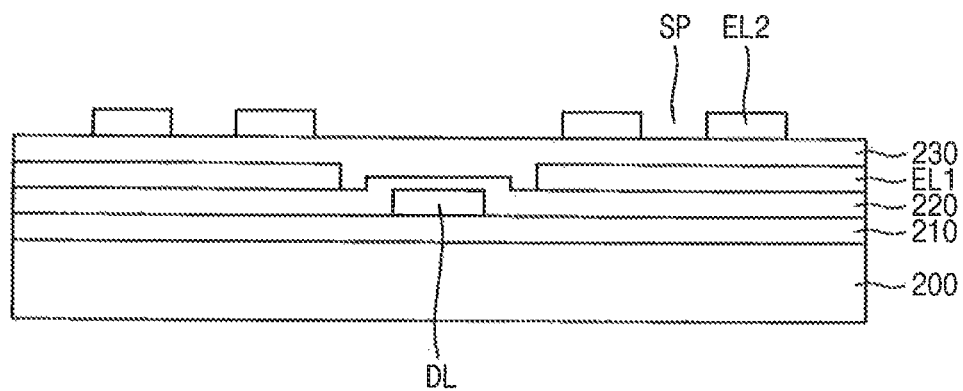
FIGS. 6A, 6C, 6E, 6G, 6I, 6K and 6L are cross-sectional views taken along line I-I' in FIG. 1 and illustrating a method of manufacturing a display panel in accordance with exemplary embodiments of the present invention.
Figure 6B:
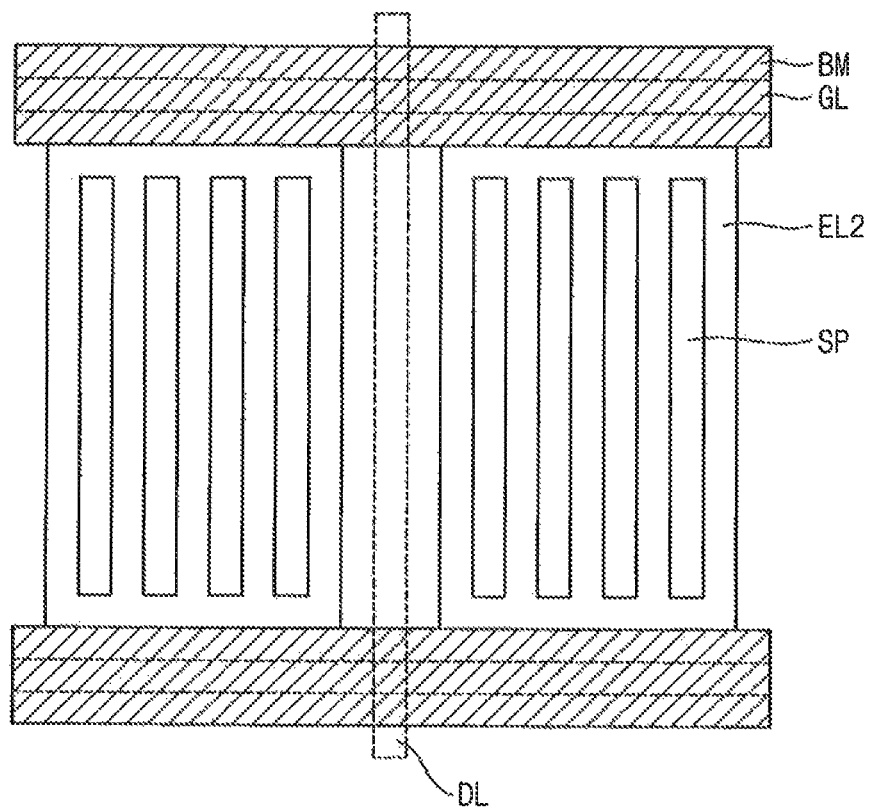
FIGS. 6B, 6D, 6F, 6H and 6J are plan views illustrating a method of manufacturing a display panel in accordance with exemplary embodiments of the present invention.

Referring to FIGS. 2, 6A and 6B, a gate pattern, a gate insulation layer 210, a semiconductor pattern SM, a data pattern, a data insulation layer 220, a first electrode EL1, a passivation layer 230, a second electrode EL2 and a black matrix BM are formed on a substrate 200.

The gate pattern may include a gate line GL and a gate electrode GE connected to the gate line GL.

The gate insulation layer 210 may cover the gate pattern.

The semiconductor pattern SM may be formed on the gate insulation layer 210. The semiconductor pattern SM overlaps the gate electrode GE.

The data pattern may include a source electrode SE, a drain electrode DE and a data line DL. The source electrode SE and the drain electrode DE contact the semiconductor pattern SM, and are spaced apart from each other. The data line GL is connected to the source electrode SE.

The data insulation layer 220 may cover the data pattern.

The first electrode EL1 may be formed on the data insulation layer 220. The passivation layer 230 may cover the first electrode EL1.

The second electrode EL2 may be formed on the passivation layer 230. The second electrode EL2 includes a plurality of slits SP. For example, the slits SP may extend in a direction substantially parallel to the data line DL.

The black matrix BM may overlap the gate line GL. The black matrix BM may have a linear shape extending a direction substantially parallel to the gate line GL. The black matrix BM may be formed on the passivation layer 230. In another exemplary embodiment, the black matrix BM may be formed on the data insulation layer 220 to be disposed between the data insulation layer 220 and the passivation layer 230. In another exemplary embodiment, the black matrix BM may be omitted.

Figure 6C:
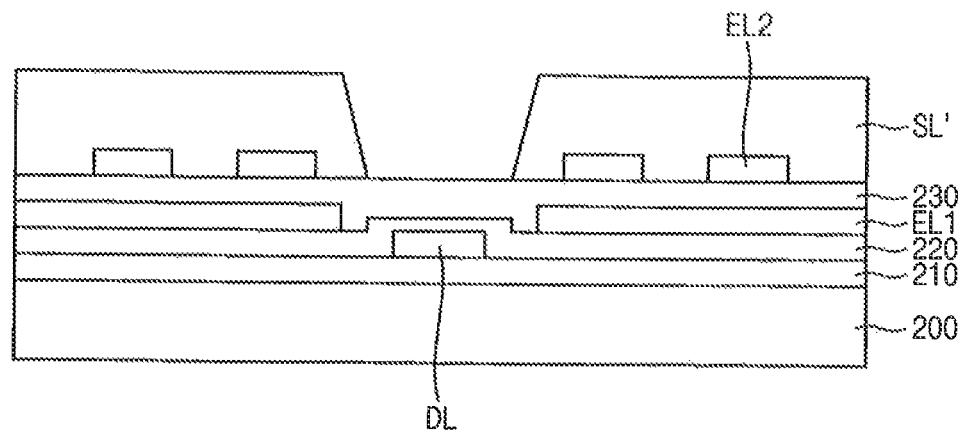
Figure 6D:
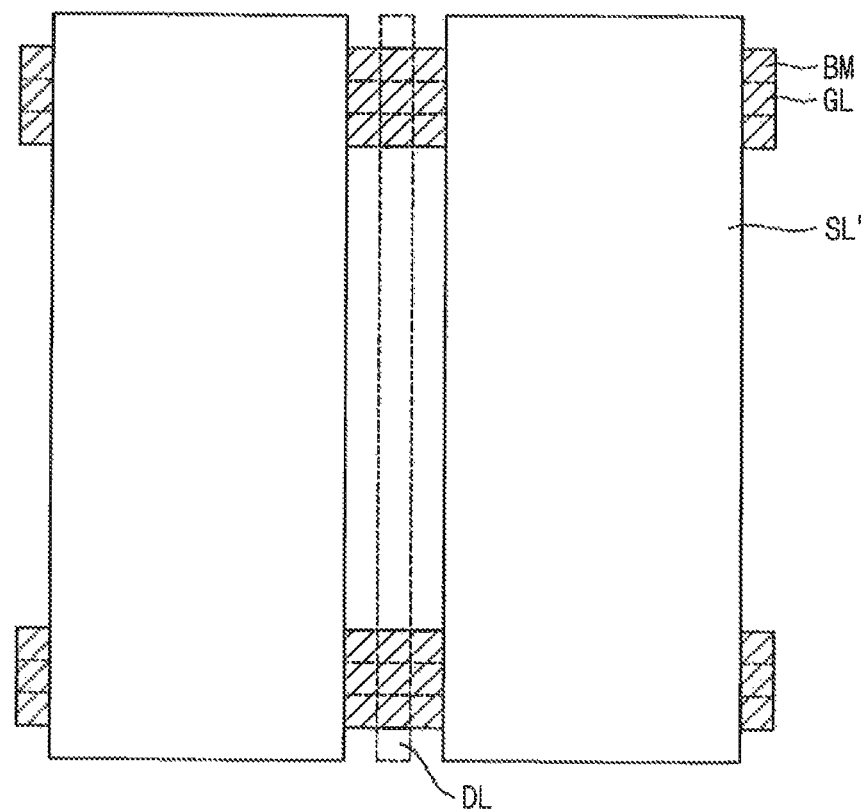

Referring to FIGS. 6C and 6D, a sacrificial pattern SL' may be formed on the second electrode EL2. The sacrificial pattern SL' may entirely cover the second electrode EL2. The sacrificial pattern SL' may further cover the black matrix BM. The sacrificial pattern SL' may be formed through a substantially same method as the sacrificial pattern SL' illustrated in FIG. 4C.

Figure 6E:
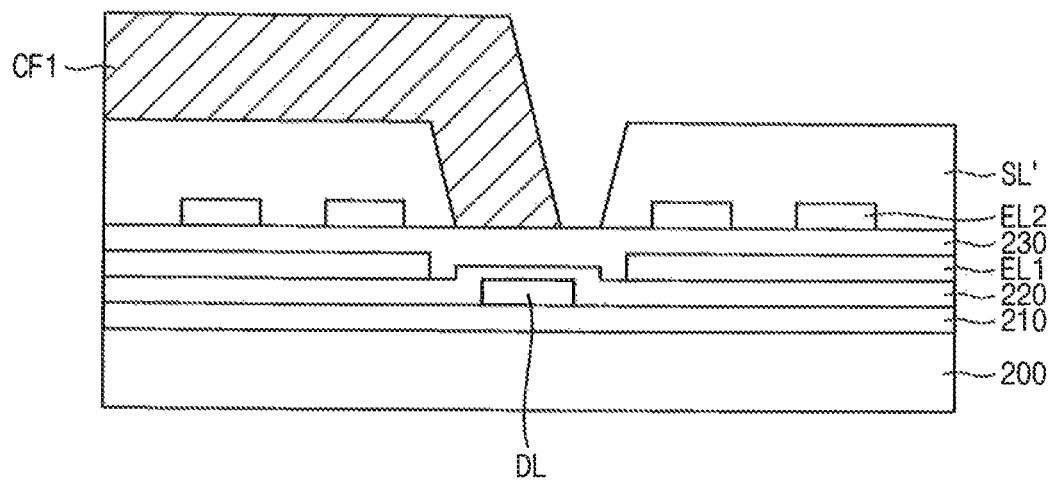
Figure 6F:
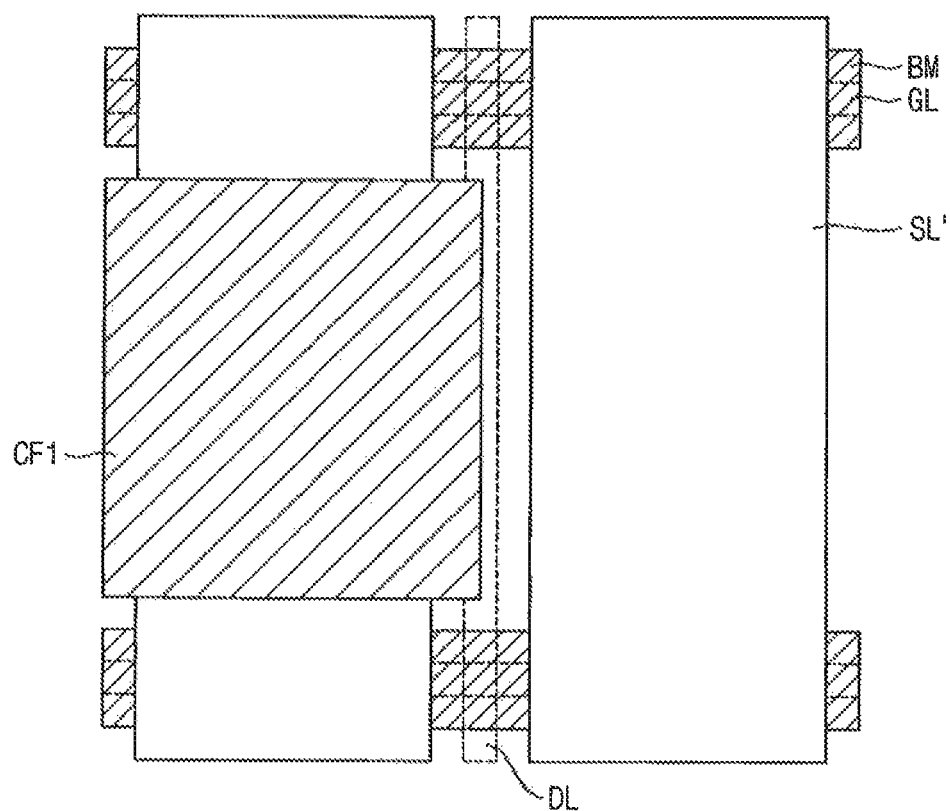

Referring to FIGS. 6E and 6F, a first color filter CF1 may be formed on a first sacrificial pattern SL'. For example, a photoresist composition may be coated on the first sacrificial pattern SL', and exposed to a light and developed to form the first color filter CF1. The photoresist composition may be a negative photoresist composition. The photoresist composition may include an acryl compound, a photo initiator, a coloring agent and a solvent.

Examples of the acryl compound may include polyacrylate resin or poly methacrylate resin. Examples of the photo initiator may include a halogen-containing iminosulfonate photo initiator, a diazonaphthoquinone-4-sulfonate photo acid generator, or a triazine photo initiator. The solvent may include propylene glycol methyl ether acetate (PGMEA).

For example, the photoresist composition may include about 5 wt % to about 70 wt % of the acryl compound, about 1 wt % to about 35 wt % of the photo initiator, about 1 wt % to about 30 wt % of the coloring agent and a remainder of the solvent.

The sacrificial pattern SL' may include a positive photoresist composition. Thus, the sacrificial pattern SL' may not be mixed with the negative photoresist composition for forming a color filter so that a separation between the sacrificial pattern SL' and the color filter may be maintained.

The first color filter CF1 has a specific color, and is formed in certain pixels of the entire pixels. For example, the first color filter CF1 may include a red coloring agent. The photoresist composition may include the red coloring agent such as a red pigment to form a red color filter.

Figure 6G:
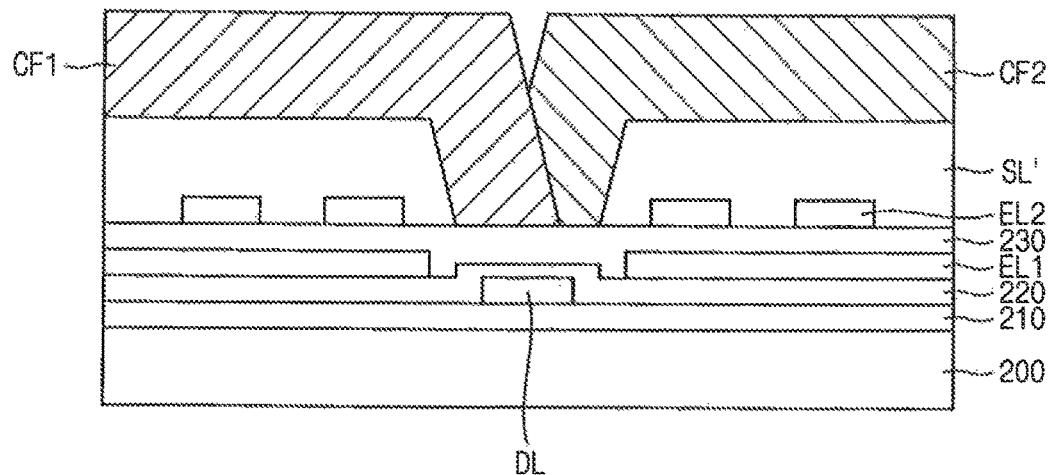
Figure 6H:
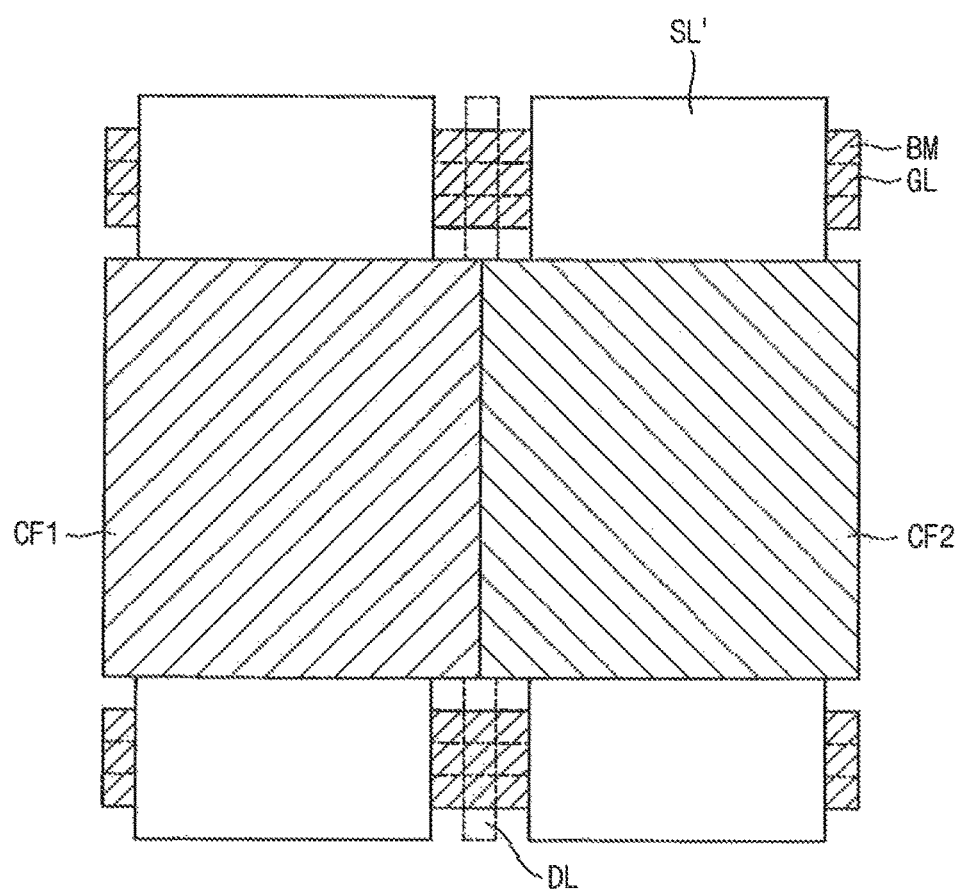

Referring to FIGS. 6G and 6H, a second color filter CF2 may be formed on a second sacrificial pattern SL'. The second color filter CF2 may be adjacent to the first color filter CF1, and may partially overlap the first color filter CF1. The second color filter CF2 may include a coloring agent different from the first color filter CF1, for example, a green coloring agent. A photoresist composition including a green pigment may be used for forming a green color filter.

Even if not illustrated, at least one color filter having a different color from the first color filter CF1 and the second color filter CF2 may be further formed through a substantially same method as the first color filter CF1 and the second color filter CF2. For example, a third color filter may be a blue filter. A fourth color filter may be a white filter, a yellow filter, a cyan filter or a magenta filter.

The color filters overlap the second electrode EL2. Thus, a portion of the sacrificial pattern SL' may be uncovered by the color filters and exposed.

Figure 6I:
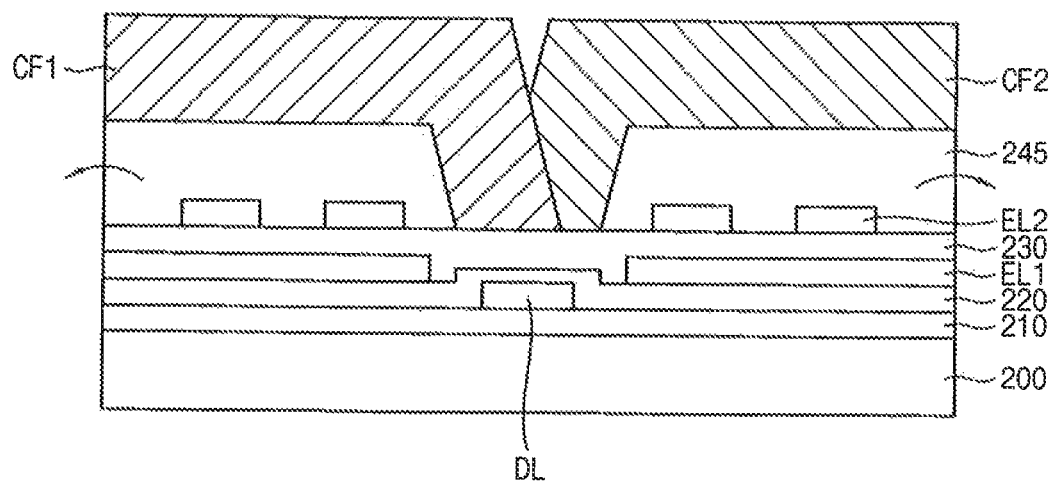
Figure 6J:
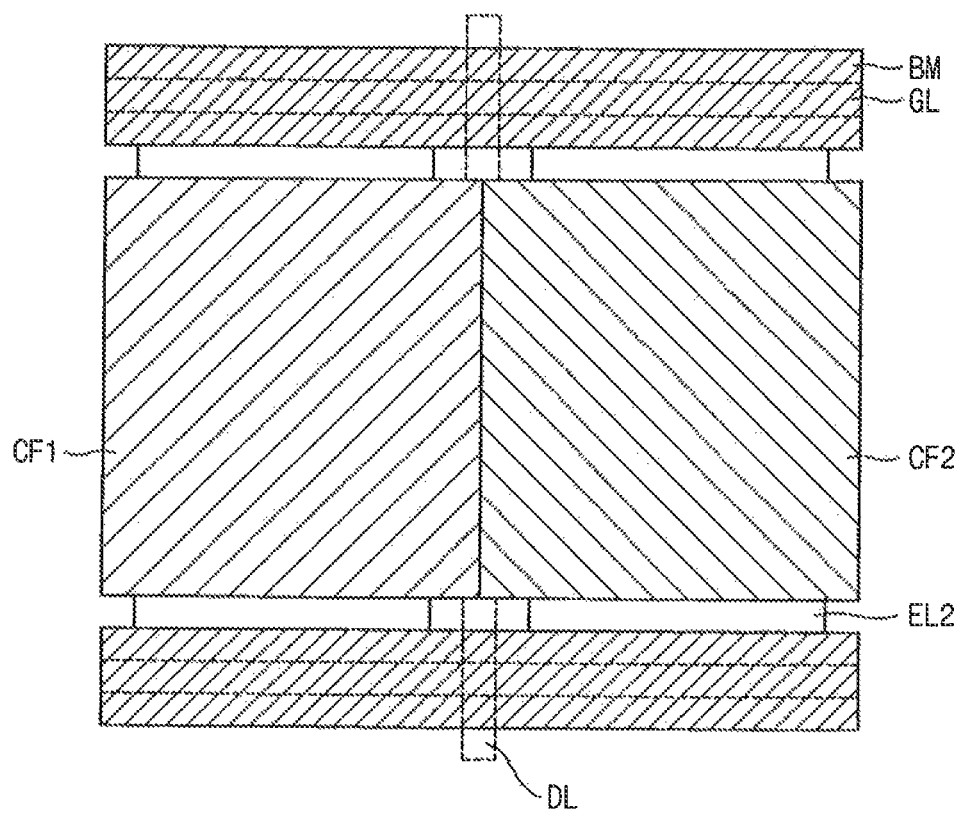

Referring to FIGS. 6I and 6J, the sacrificial pattern SL' may be removed. A stripper is provided to remove the sacrificial pattern SL'. Furthermore, the substrate including the sacrificial pattern SL' may be entirely exposed to a light to increase a solubility of the sacrificial pattern SL' before the stripper is provided.

A portion of the sacrificial pattern SL' is uncovered by the color filters. Thus, the sacrificial pattern SL' may easily contact the stripper. When the sacrificial pattern SL' is removed, a cavity 245 may be formed in a position where the sacrificial pattern SL' was formed. The cavity 245 may have a tunnel shape extending in a direction. For example, the cavity 245 may extend in a direction substantially parallel to the data line DL. A plurality of cavities 245 may be spaced apart from each other in a direction parallel to the gate line GL. In a plan view, the data line DL may be disposed between adjacent cavities 245.

The stripper may include an alkali solution. For example, the stripper may be an amide solution. The stripper including the amide solution may entirely remove the sacrificial pattern SL' including the polyamide compound without damaging a structure of the color filters.

Figure 6K:
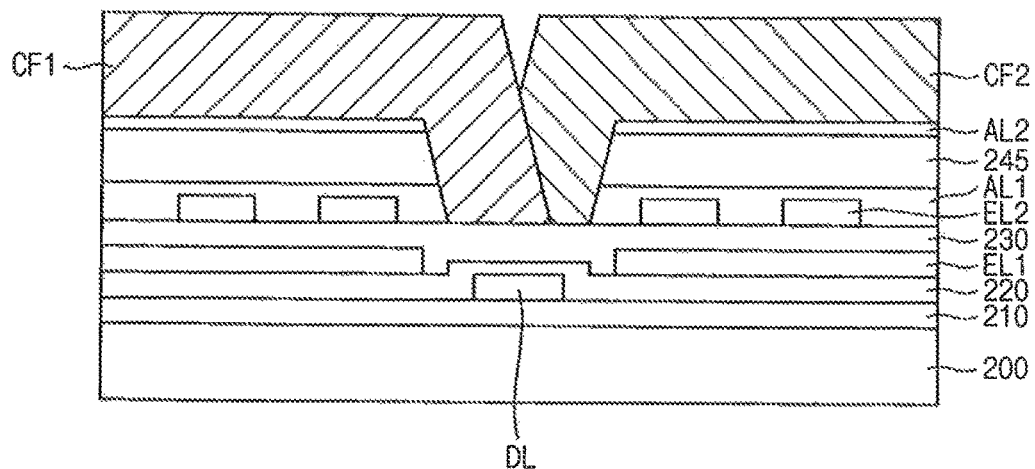

Referring to FIG. 6K, an alignment layer is formed in the cavity 245. An aligning composition may be provided in the cavity 245 to form the alignment layer.

The alignment layer may include a lower alignment layer AL1 covering the second electrode EL2, and an upper alignment layer AL2 covering a lower surface of the color filter. While the lower alignment layer AL1 and the upper alignment layer AL2 are illustrated to be spaced apart from each other, the lower alignment layer AL1 and the upper alignment layer AL2 may be substantially connected to each other.

After the alignment layer is formed, a liquid crystal material may be provided in the cavity 245 to form a liquid crystal layer. Thus, the alignment layer may be in direct contact with the liquid crystal layer. If the alignment layer is omitted in another exemplary embodiment, the color filter may be in direct contact with the liquid crystal layer.

Figure 6L:
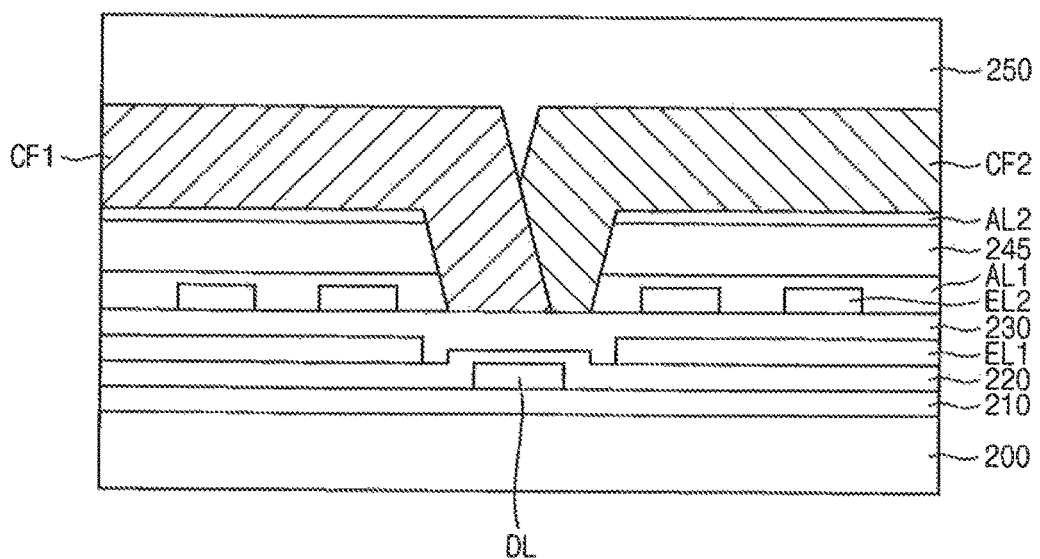

Referring to FIG. 6L, a protection layer 250 may be formed to cover the color filter. The protection layer 250 may protect the color filter, and may include an organic material or an inorganic material. Furthermore, the protection layer 250 may have a single-layered structure or a multiple-layered structure including an organic material layer and an inorganic material layer.

The display panel and the method for manufacturing the display panel according to exemplary embodiments of the present invention may be used for a liquid crystal display panel including one base substrate and a liquid crystal display apparatus having the same.

In accordance with exemplary embodiments of the present invention, a sacrificial layer and a roof layer may formed in phase separable materials so that the roof layer may be directly formed on an upper surface of the sacrificial layer without forming an inorganic layer on the sacrificial layer, thus reducing the number of masks. Therefore, a hard-baking process of the sacrificial layer may be skipped so that an aperture ratio is increased.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A display panel comprising:
   a substrate;
   a thin-film transistor (TFT) disposed on the substrate;
   a first electrode electrically connected to the thin-film transistor;
   a roof layer positioned above the first electrode and substantially consisting of an organic insulating material to exclude an inorganic layer and defining a cavity that overlaps the first electrode; and a liquid crystal layer disposed in the cavity, wherein the roof layer is in direct contact with an upper surface of the liquid crystal layer facing away from the first electrode, and wherein a portion of the roof layer extends continuously from a portion above the liquid crystal layer to be in direct contact with a passivation layer disposed on the first electrode.

2. The display panel of claim 1, wherein the cavity has a tunnel shape.

3. The display panel of claim 1, wherein the roof layer is a color filter.

4. The display panel of claim 1, further comprising a color filter overlapping the first electrode.

5. The display panel of claim 1, further comprising a second electrode overlapping the first electrode and receiving a common voltage, wherein the first electrode or the second electrode includes a plurality of slits.

6. The display panel of claim 1, wherein the roof layer includes a negative photoresist composition comprising an acryl compound and a photoinitiator.

7. A display panel comprising:
a substrate;
a thin-film transistor (TFT) disposed on the substrate;
a first electrode electrically connected to the thin-film transistor;
a roof layer positioned above the first electrode and defining a cavity that overlaps the first electrode;
an alignment layer disposed in the cavity and being in direct contact with the roof layer; and
a liquid crystal layer disposed in the cavity and being in direct contact with the alignment layer,
wherein the roof layer is in direct contact with and covers an upper surface of the alignment layer facing way from the liquid crystal layer, and wherein a portion of the roof layer extends continuously from the upper surface of the alignment layer to be in direct contact with a passivation layer disposed on the first electrode.

8. The display panel of claim 7, wherein the roof layer is a color filter.

9. The display panel of claim 7, further comprising a color filter overlapping the first electrode.

10. A method of manufacturing a display panel, the method comprising:
forming a thin-film transistor (TFT) and a first electrode electrically connected to the thin-film transistor on a substrate;
depositing a positive photoresist composition on the first electrode to form a sacrificial layer;
light-exposing and developing the sacrificial layer to form a sacrificial pattern;
depositing a negative photoresist composition on the sacrificial pattern to form a roof layer entirely covering the sacrificial pattern; and
removing the sacrificial pattern to form a cavity.

11. The method of claim 10, further comprising:
forming a color filter overlapping the first electrode and disposed under the color filter.

12. The method of claim 10, further comprising:
injecting a liquid crystal into the cavity to form a liquid crystal layer.

13. The method of claim 10, wherein the cavity has a tunnel shape.

14. The method of claim 13, wherein an amide stripper is provided to the sacrificial pattern to remove the sacrificial pattern.

15. The method of claim 10, wherein the positive photoresist composition comprises a polyamide compound, a photosensitive quinone diazide compound and a first solvent.

16. The method of claim 15, wherein the first solvent comprises propylene glycol monomethyl ether (PGME), cyclohexanone, ethyle lactate (EL), γ-butyrolactone (GBL) or N-methylpyrrolidione (NMP).

17. The method of claim 15, wherein the negative photoresist composition comprises an acryl compound, a photo initiator, a coloring agent and a second solvent, and the roof layer is a color filter partially covering the sacrificial pattern.

18. The method of claim 17, further comprising:
forming a protection layer covering the color filter.

19. The method of claim 15, wherein the negative photoresist composition comprises an acryl compound, a photo initiator and a second solvent.

20. The method of claim 19, wherein the polyamide compound is insoluble in the second solvent, and the acryl compound is insoluble in the first solvent.

21. The method of claim 19, wherein the second solvent comprises propylene glycol methyl ether acetate (PGMEA).

* * * * *